United States Patent [19]
Murakami et al.

[11] Patent Number: 5,337,004
[45] Date of Patent: Aug. 9, 1994

[54] SYSTEM FOR INSPECTING ELECTRICALLY CONDUCTIVE PATTERNS SUCH AS ANTENNA PATTERNS ON WINDOW GLASS

[75] Inventors: Harunori Murakami; Shohei Ohara, both of Toride, Japan

[73] Assignee: Nippon Sheet Glass Co., Ltd., Japan

[21] Appl. No.: 919,532

[22] Filed: Jul. 24, 1992

[30] Foreign Application Priority Data

Jul. 24, 1991 [JP] Japan .................... 3-207336

[51] Int. Cl.$^5$ ............................. G01R 31/00
[52] U.S. Cl. .................... 324/505; 324/520; 324/707
[58] Field of Search ........... 324/213, 239, 240, 505, 324/520, 525, 529–530, 537, 654, 655, 656, 691, 693, 696, 702, 707

[56] References Cited

U.S. PATENT DOCUMENTS

| | | | |
|---|---|---|---|
| 3,992,663 | 11/1976 | Seddick | 324/537 |
| 4,276,509 | 6/1981 | Bryant et al. | 324/505 |
| 4,409,541 | 10/1983 | Richards | 324/505 |
| 4,546,441 | 10/1985 | Burch | 324/617 |
| 4,565,966 | 1/1986 | Burr et al. | 324/525 |
| 4,712,057 | 12/1987 | Pau | 324/158 R |
| 4,743,847 | 5/1988 | Frushour | 324/158 R |
| 4,780,661 | 10/1988 | Bolomey et al. | 324/638 |
| 4,905,261 | 2/1990 | Knight | 377/19 |
| 4,939,469 | 7/1990 | Ludwig et al. | 324/707 |
| 5,028,866 | 7/1991 | Wiese | 324/158 F |

FOREIGN PATENT DOCUMENTS

| | | |
|---|---|---|
| 0123828 | 7/1984 | European Pat. Off. . |
| 0129508 | 12/1984 | European Pat. Off. . |
| 0196496 | 8/1986 | European Pat. Off. . |
| 2-174138 | 7/1990 | Japan . |

*Primary Examiner*—Kenneth A. Wieder
*Assistant Examiner*—Christopher M. Tobin
*Attorney, Agent, or Firm*—Merchant, Gould, Smith, Edell, Welter & Schmidt

[57] ABSTRACT

Electrically conductive patterns such as antenna patterns on window glass are inspected for a wire break or a short circuit. The impedances between an electrically conductive pattern and an electrically conductive layer on an inspective table are measured at predetermined frequencies, or the levels of signals reflected from the electrically conductive pattern are measured at predetermined frequencies. A decision unit determines whether the electrically conductive pattern is acceptable or not based on the frequency characteristics of the electrically conductive pattern and the reference frequency characteristics of a reference electrically conductive pattern.

2 Claims, 7 Drawing Sheets

SYSTEM FOR INSPECTING ELECTRICALLY CONDUCTIVE PATTERNS SUCH AS ANTENNA PATTERNS ON WINDOW GLASS

BACKGROUND OF THE INVENTION

1. Field of the Invention

The present invention relates to a system for checking an electrically conductive pattern such as an antenna pattern on a sheet of window glass.

2. Description of the Relevant Art

FIG. 9 of the accompanying drawings shows a conventional conductivity inspecting system comprising a continuity checker 101 for checking an antenna pattern 103 on a sheet 102 of window glass for a wire break. The continuity checker 101 operates as follows: As shown in FIG. 9, the continuity checker 101 has a probe 104 positioned in contact with a terminal 100 of the antenna pattern 103. While the probe 104 is being held in contact with the terminal 100, another probe 105 of the continuity checker 101 is successively brought into contact with tip ends P1, P2, P3, P4, P5, P6 of branch arms of the antenna pattern 103 to check the entire antenna pattern 103 for a wire break. The continuity checker 101 has an electric circuit (not shown) which includes a buzzer for producing an audible sound when the resistance of an antenna pattern portion measured between the probes 104, 105 is below a predetermined value.

Another conventional conductivity inspecting system is shown in FIG. 10 of the accompanying drawings. The conductivity inspection system shown in FIG. 10 comprises a Q-meter 111 to check an antenna pattern 113 which is formed between superposed layers of a sheet 112 of laminated glass. The Q-meter 111 is used because a usual continuity checker, as shown in FIG. 9, cannot be used with the antenna pattern 113 as it is not exposed but embedded in the laminated glass 112.

In operation, while a probe 114 of the Q-meter 111 is being held in contact with a terminal 115 of the antenna pattern 113, a frequency adjusting knob 117 of the Q-meter is turned to maximize or minimize the movement of a pointer 116 of the Q-meter for thereby achieving a resonant condition. Thereafter, an operator's fingertip is brought into touch with the surface of the laminated glass 112 at a tip end 118 of the antenna pattern 113.

If the antenna pattern 113 has no wire break, then a capacitor is coupled to the tip end 118 by the operator's fingertip, resulting in a shift in the resonant frequency. Accordingly, the pointer 116 shifts from a resonant position which it has achieved previously. If the antenna pattern 113 has suffered a wire break, then the pointer 116 does not move. Therefore, if pointer 116 moves, the antenna pattern 113 is acceptable; if pointer 116 does not move, the antenna pattern 113 is unacceptable.

The continuity checker as shown in FIG. 9 is disadvantageous in that it takes a relatively long period of time to check an antenna pattern especially if the pattern has many branch arms.

The conductivity inspection system using a Q meter as shown in FIG. 10 requires a tedious and time-consuming process to achieve a resonant condition.

Another problem is that any of the conventional conductivity inspection systems fails to detect pattern short circuits other than wire breaks.

SUMMARY OF THE INVENTION

In view of the aforesaid shortcomings of the conventional conductivity inspecting systems, it is an object of the present invention to provide a system for automatically detecting wire breaks and pattern short circuits in an electrically conductive pattern.

According to the present invention, there is provided a system for inspecting an electrically conductive pattern on an insulative material, comprising an electrically conductive layer adapted to be spaced from the electrically conductive pattern, impedance measuring means for measuring impedances between the electrically conductive pattern and the electrically conductive layer in a predetermined range of frequencies, and decision means for determining whether the electrically conductive pattern is acceptable or not, based on the frequency characteristics of the measured impedances and the reference frequency characteristics of impedances of a reference electrically conductive pattern.

The decision means may comprise first memory means for storing data indicative of the measured impedances, second memory means for storing data indicative of the impedances of the reference electrically conductive pattern, and means for comparing the data stored in the first and second memory means and determining that the electrically conductive pattern is acceptable if the difference between the compared data is smaller than a predetermined value. Alternatively, the decision means may comprise first memory means for storing data indicative of the measured impedances, second memory means for storing data indicative of the impedances of the reference electrically conductive pattern, and means for comparing the data stored in the first and second memory means and determining that a shift between the frequency characteristics of the measured impedances and the reference frequency characteristics smaller than a predetermined value.

The impedance measuring means comprises an impedance bridge having an arm for connection to the electrically conductive pattern and the electrically conductive layer, a variable frequency oscillator for supplying high-frequency signals in the predetermined range of frequencies to the impedance bridge, and means for supplying impedance signals indicative of the measured impedances from the impedance bridge to the decision means.

According to the present invention, there is also provided a system for inspecting an electrically conductive pattern on an insulative material, comprising an electrically conductive layer adapted to be spaced from the electrically conductive pattern, variable frequency signal supply means for successively supplying high-frequency signals in a predetermined range of frequencies to the electrically conductive pattern, reflected signal measuring means for measuring reflected signals from the electrically conductive pattern, and decision means for determining whether the electrically conductive pattern is acceptable or not, based on the frequency characteristics of the measured reflected signals and the reference frequency characteristics of reflected signals from a reference electrically conductive pattern.

The reflected signal measuring means comprises a directional coupler for supplying the high-frequency signals to the electrically conductive pattern and extracting the reflected signals from the electrically conductive pattern, a signal distributor for supplying the high-frequency signals from the variable frequency signal supply means to the directional coupler, and a processor for calculating the ratio between the reflected signals extracted by the directional coupler and the high-frequency signals from the signal distributor, and supplying the calculated ratio to the decision means.

The above and other objects, features, and advantages of the present invention will become apparent from the following description of illustrative embodiments thereof to be read in conjunction with the accompanying drawings, in which like reference numerals represent the same or similar objects.

DETAILED DESCRIPTION OF THE PREFERRED EMBODIMENTS

Figure 1:
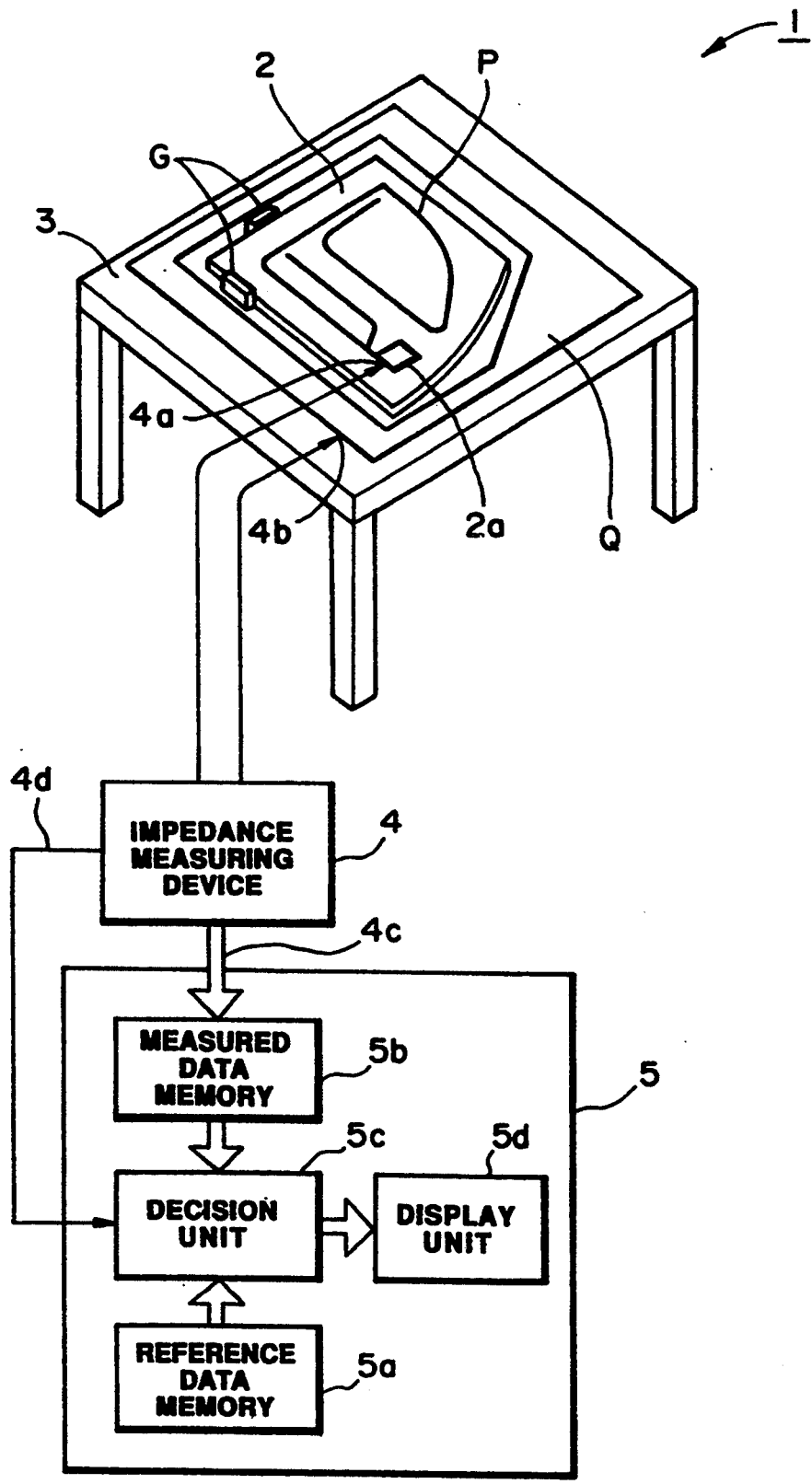
FIG. 1 is a block diagram, partly shown in perspective, of a conductivity inspecting system according to an embodiment of the present invention.

Like or corresponding parts are denoted by like or corresponding reference characters throughout views.

FIG. 1 shows, partly in perspective, a conductivity inspecting system according to an embodiment of the present invention.

The conductivity inspecting system, generally designated by the reference numeral 1, serves to automatically detect a wire break or a short circuit of an electrically conductive pattern, e.g., an antenna pattern P on a sheet 2 of window glass such as an automobile window glass sheet. As shown in FIG. 1, the conductivity inspecting system comprises an inspecting table 3, an impedance measuring device 4, and a decision device The inspecting table 3 has a plurality of positioning guides G on its upper support panel for positioning the window glass 2, and also has an electrically conductive layer Q. The electrically conductive layer Q surrounds the antenna pattern P when window glass 2 is placed on the upper support panel of the inspecting table 3. Alternatively, the electrically conductive layer Q may be elevationally spaced with respect to the window glass 2.

The upper support panel of the inspecting table 3 may be made of an electrically conductive material such as iron or the like, and may have a recess defined therein for placing the window glass 2 in spaced relationship to the surrounding upper support panel. In such a modification, the upper support panel of the inspecting table 3 doubles as the electrically conductive layer Q.

The impedance measuring device 4 comprises a high-frequency LCR meter or the like for measuring impedances at a plurality of predetermined frequencies, and outputting measured impedances to an external device through an interface bus such as a GP-IB or the like. The impedance measuring device 4 has a probe 4a connected to a terminal a of the antenna pattern P at an end of the window glass 2, and another probe 4b connected to the electrically conductive layer Q.

The frequencies at which impedances are to be measured by the impedance measuring device 4 are selected as follows: A sheet 2 of window glass with a reference antenna pattern P which is free of wire breaks and short circuits is placed on the inspecting table 3. Impedances between the reference antenna pattern P and the electrically conductive layer Q are measured at various many frequencies by the impedance measuring device 4. The measuring frequencies are selected such that peaks and valleys, i.e., sharply varying portions, of the frequency characteristic curve of the impedances can distinctly be recognized by the operator. The frequency characteristic curve thus obtained with respect to the reference antenna pattern P is used as a reference frequency characteristic curve.

The decision device 5 comprises a reference data memory 5a for storing the impedances of the reference frequency characteristic curve at the predetermined frequencies, a measured data memory 5b for temporarily storing measured impedance data outputted from the impedance measuring device 4, a decision unit 5c for reading the data from the reference data memory 5a and the measured data memory 5b, comparing the read data with each other, and determining whether the measured impedance data is good or bad (i.e., acceptable or not), and a display unit 5d for displaying whether the measured impedance data is good or bad based on an output signal from the decision unit 5c.

The reference data memory 5a may comprise a RAM or the like which is backed up by a battery. Typically, the reference data memory 5a stores reference impedance data inputted from a data input device (not shown). However, when the reference antenna pattern is measured by the impedance measuring device 4, the measured impedance data may be stored as reference impedance data directly into the reference data memory 5a.

The measured data memory 5b comprises a RAM or the like.

The decision unit 5c, which may comprise a microprocessor or the like, starts to operate to determine whether the measured impedance data is good or bad in response to a start command 4d which is supplied from the impedance measuring device 4 when the measurement of impedances at the predetermined frequencies is completed. The decision unit 5c is programmed to read the measured and reference impedance data from the memories 5a, 5b, compare them at each of the predetermined frequencies, and determine that the measured impedance data is bad when the difference between the compared impedance data exceeds a predetermined tolerance. The decision unit 5c is also programmed to detect the frequencies at the peaks and valleys of the frequency characteristic curve of the measured impedance data, compares the detected frequencies with the frequencies at the peaks and valleys of the frequency characteristic curve of the reference impedance data, and determine that the measured impedance data is bad if the difference between the compared frequencies is in excess of a predetermined tolerance.

In operation, a sheet 2 of window glass to be inspected is placed on the inspecting table 3, and then a start switch (not shown) of the system is turned on to enable the impedance measuring device 4 to measure and output impedances between the antenna pattern P and the electrically conductive layer Q at the respective predetermined frequencies.

The measured impedance data from the impedance measuring device 4 is temporarily stored in the measured impedance memory 5b. In response to a start command 4d from the impedance measuring device 4, the decision unit 5 starts to determine whether the measured impedance data is good or bad, and then supplies decision data to the display unit 5d which displays information indicating the decision result.

The probe 4a and the terminal 2a of the antenna pattern P may be arranged such that they will automatically be brought into contact with each other when the window glass 2 is placed on the inspecting table 3.

Figure 2:
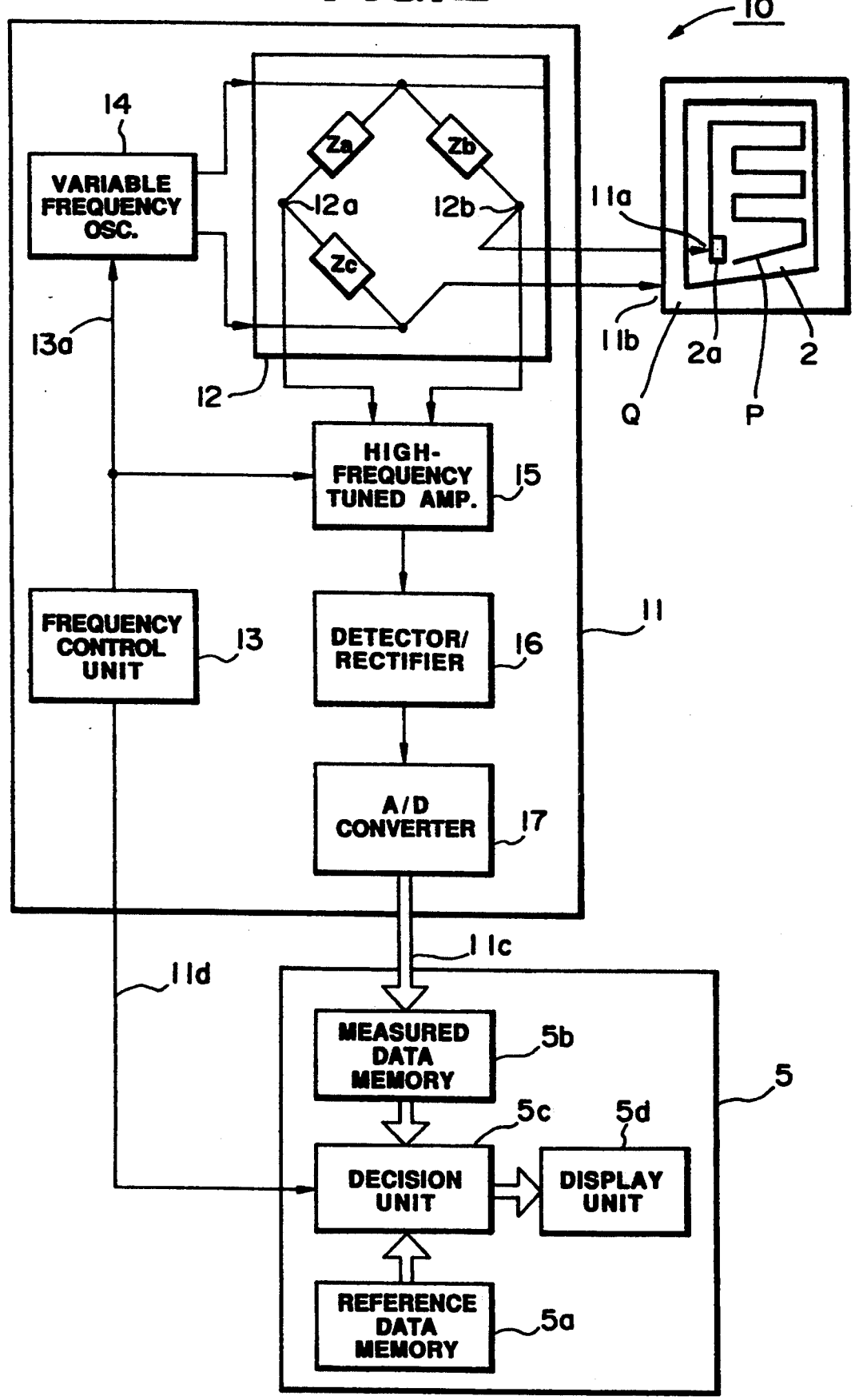
FIG. 2 is a block diagram of a conductivity inspecting system according to another embodiment of the present invention.

FIG. 2 shows a conductivity inspecting system according to another embodiment of the present invention.

As shown in FIG. 2, the conductivity inspecting system, generally designated by the reference numeral 10, includes an impedance measuring device 11 having an impedance bridge 12 having one arm connected to the antenna pattern P and the electrically conductive layer Q, for producing a high-frequency voltage signal representative of the impedance between the antenna pattern P and the electrically conductive layer Q based on the voltage between terminals 12a, 12b.

The impedance bridge 12 has impedances Za, Zb, Zc in the other arms. These impedances Za, Zb, Zc are not varied for balancing the impedance bridge 12. Rather, the voltage generated between the terminals 12a, 12b is regarded as a value relative to the impedance between the antenna pattern P and the electrically conductive layer Q. Therefore, the impedance between the antenna pattern P and the electrically conductive layer Q can quickly be measured.

The impedance measuring device 11 also has a frequency control unit 13. In response to a measurement start signal, the frequency control unit 13 produces a series of frequency information 13a which indicates successive frequencies that are to be produced by a variable frequency oscillator 14. The frequency information 13 is supplied to the variable frequency oscillator 14. When all the frequency information 13a has been produced and the variable frequency oscillator 14 has generated the indicated frequencies successively, the frequency control unit 13 applies a start command 11d to the decision device 5.

The variable frequency oscillator 14 generates and outputs high-frequency signals at the frequencies indicated by the frequency information 13a from the frequency control unit 13, the high-frequency signals having a predetermined level.

If the variable frequency oscillator 14 comprises a voltage-controlled oscillator, the frequency control unit 13 supplies a voltage signal as the frequency information 13a to the variable frequency oscillator 14. If the variable frequency oscillator 14 comprises a digital frequency-dividing oscillator, the frequency control unit 13 supplies frequency division information as the frequency information 13a to the variable frequency oscillator 14.

The high-frequency voltage signal generated between the terminals 12a, 12b is selectively amplified by a high-frequency tuned amplifier 15. The amplified signal from the high-frequency tuned amplifier 15 is detected and rectified by a detector/rectifier 16 into a DC signal, which is then converted by an A/D converter 17 into a digital signal 11c that is supplied to the decision device 5.

The high-frequency tuned amplifier 15 serves to selectively amplify voltage signals at the frequencies indicated by the frequency information 13d from the frequency control unit 13. Therefore, the high-frequency tuned amplifier 15 is effective to reduce noise in the voltage signals for higher measurement accuracy.

The decision device 5 is basically the same as the decision device 5 shown in FIG. 1.

The conductivity inspecting system shown in FIG. 2 operates as follows:

A sheet 2 of window glass with an antenna pattern P to be inspected is placed in position with respect to the electrically conductive layer Q. Probes 11a, 11b of the impedance measuring device 11 are connected respectively to the terminal 2a of the antenna pattern P and the electrically conductive layer Q. A start switch (not shown) of the system is turned on to enable the impedance measuring device 11 to measure and output impedances between the antenna pattern P and the electrically conductive layer Q at the respective predetermined frequencies.

The impedance measuring device 4 then produces and supplies digital data 11c indicative of the measured impedances to the measured impedance memory 5b, which temporarily stores the supplied digital data 11c. In response to a start command 11d from the impedance measuring device 11, the decision unit 5 starts to determine whether the measured impedance data is good or bad, and then supplies decision data to the display unit 5d which displays information indicating the decision result.

Figure 3:
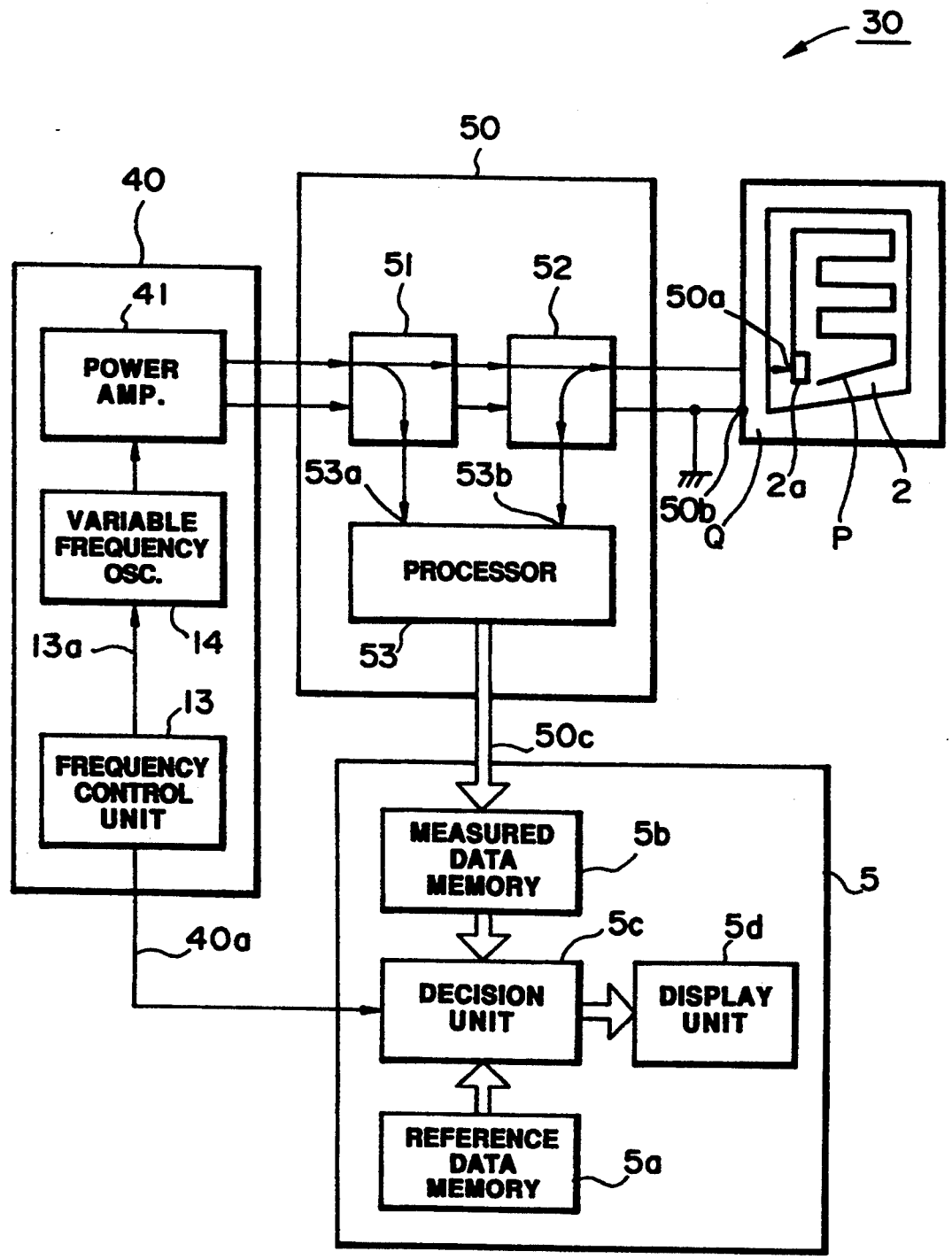
FIG. 3 is a block diagram of a conductivity inspecting system according to still another embodiment of the present invention.

FIG. 3 illustrates a conductivity inspecting system according to still another embodiment of the present invention.

The conductivity inspecting system, generally designated by the reference numeral 30 in FIG. 3, basically comprises a variable frequency signal supply device 40, a reflected signal measuring device 50, and a decision device 5. The decision device 5 is the same as the decision device 5 shown in FIG. 1.

The variable frequency signal supply device 40 comprises a frequency control unit 13, a variable frequency oscillator 14, and a power amplifier 41. The frequency control unit 13 and the variable frequency oscillator 14 are identical to those shown in FIG. 2.

The power amplifier 41 amplifies a high-frequency signal from the variable frequency oscillator 14 to a predetermined level, and supplies the amplified high-frequency signal to the reflected signal measuring device 50.

The reflected signal measuring device 50 comprises a signal distributor 51, a directional coupler 52, and a processor 53.

The signal distributor 51 distributes the high-frequency signal supplied from the power amplifier 41 into high-frequency signals at a predetermined ratio. The distributed high-frequency signals are then supplied respectively to an input terminal 53a of the processor 53 and the directional coupler 52.

The directional coupler 52 supplies the high-frequency signal from the signal distributor 51 to a terminal 2a of an antenna pattern P on a sheet 2 of window glass, and also supplies a high-frequency signal reflected by the antenna pattern P to another input terminal 53b of the processor 53.

The processor 53 calculates the ratio between the level of the high-frequency signal supplied to the input terminal 53a and the level of the reflected signal supplied to the input terminal 53b, and outputs the calculated ratio as digital data 50c to the decision device 5.

Operation of the conductivity inspecting system shown in FIG. 3 will be described below.

A sheet 2 of window glass with an antenna pattern P to be inspected is placed in position with respect to the electrically conductive layer Q. Probes 50a, 50b of the reflected signal measuring device 50 are connected respectively to the terminal 2a of the antenna pattern P and the electrically conductive layer Q. At this time, the probe 50b and hence the electrically conductive layer Q are connected to ground. A start switch (not shown) of the system is turned on to enable the variable frequency signal supply device 40 to supply frequency signals at respective predetermined frequencies successively to the reflected signal measuring device 50.

The reflected signal measuring device 50 outputs digital data 50c representative of ratios between the levels of high-frequency signals supplied to the antenna pattern P and the levels of high-frequency signals reflected by the antenna pattern P.

The measured impedance memory 5b temporarily stores the supplied digital data 50c. In response to a start command 40a from the variable frequency signal supply device 40, the decision unit 5 starts to determine whether the measured impedance data is good or bad based on the difference between the ratio calculated by the processor 53 and that of reflected signals from a reference antenna pattern, and then supplies decision data to the display unit 5d which displays information indicating the decision result.

Since the processor 53 in the reflected signal measuring device 50 outputs, as digital data, ratios between the levels of high-frequency signals supplied to the antenna pattern P and the levels of high-frequency signals reflected by the antenna pattern P, the digital data outputted by the processor 53 is not affected by variations in the levels of the high-frequency signals supplied from the variable frequency signal supply device 40. Therefore, the measured data is relatively high in accuracy.

Figure 4:
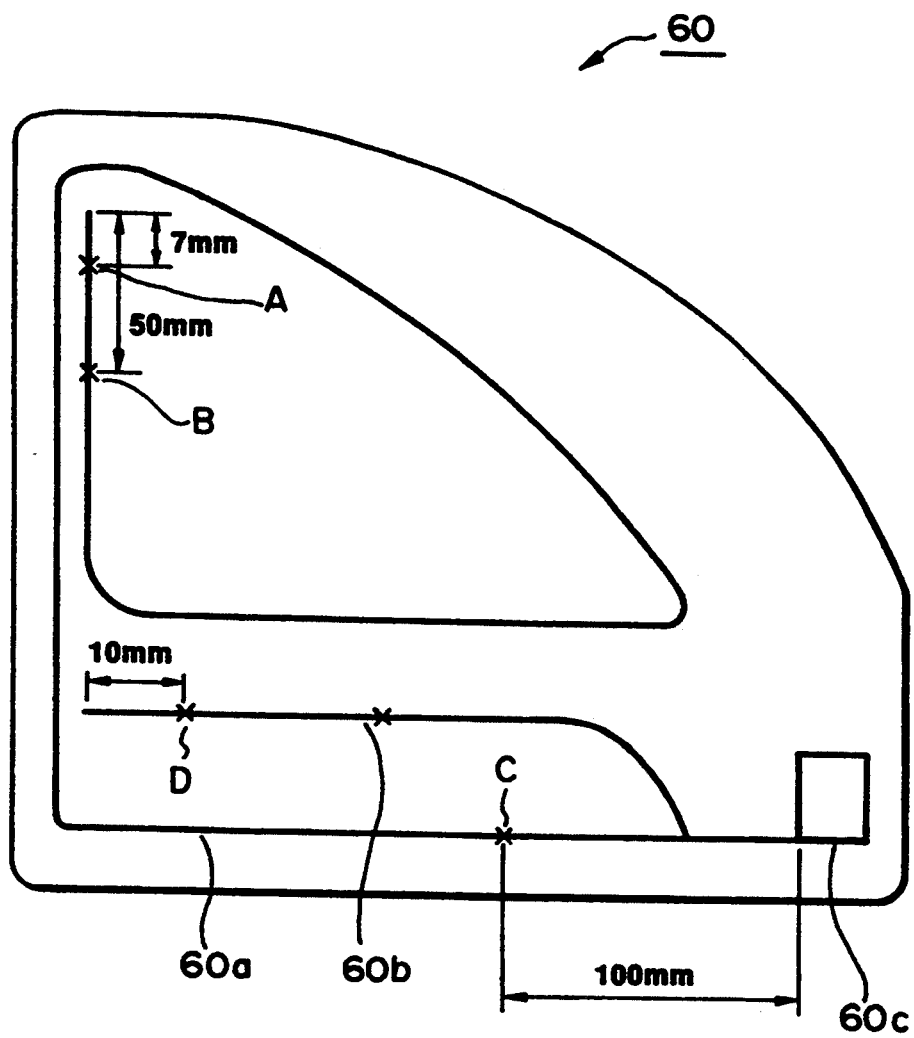
FIG. 4 is a view showing the antenna pattern of a window glass antenna that was tested.

FIG. 4 shows a sheet of window glass incorporating an antenna pattern which was inspected in a test, for example, by the conductivity inspecting system shown in FIG. 3.

As shown in FIG. 4, the antenna pattern, generally designated by the reference numeral 60, has two branch patterns 60a, 60b, and a terminal 60c.

The graphs of FIG. 5 through 8 have a horizontal axis representing frequencies of the input signal and a vertical axis representing the impedance as measured at 50(c). The solid line curves represent the characteristic curve of the reference antenna pattern which is free of wire breaks and short circuits. The dotted line curves represent the characteristic curve of the antenna pattern which is being inspected.

Figure 5:
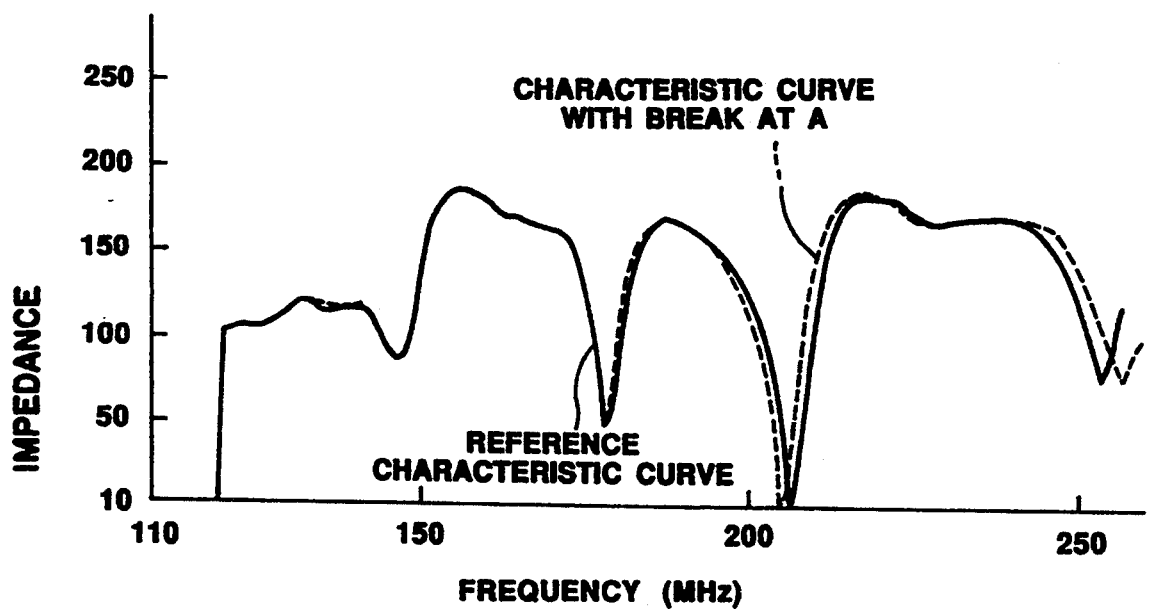
FIGS. 5 through 8 are graphs showing frequency shifts that occurred when the antenna pattern shown in FIG. 4 suffered wire breaks at different positions.

FIG. 5 shows data measured at various frequencies between the antenna pattern 60 and the electrically conductive layer Q, the antenna pattern 60 having a wire break at a position A (FIG. 4) which is about 7 mm spaced from the tip end of the branch pattern 60a.

Figure 6:
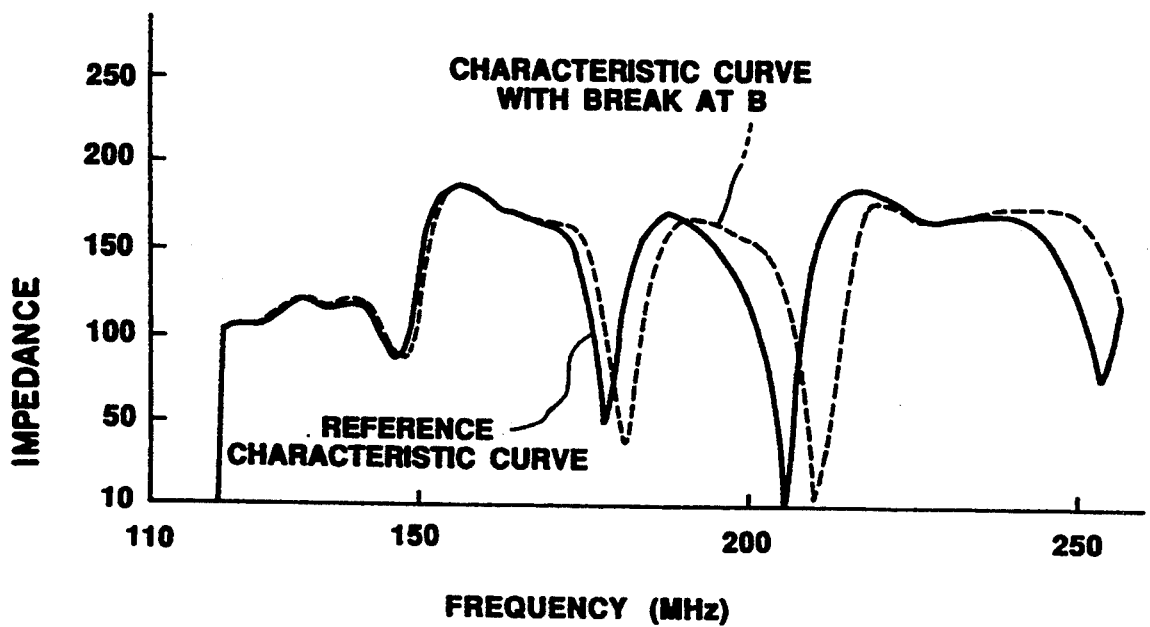

FIG. 6 shows data measured at various frequencies between the antenna pattern 60 and the electrically conductive layer Q, the antenna pattern 60 having a wire break at a position B (FIG. 4) which is about 50 mm spaced from the tip end of the branch pattern 60a.

Figure 7:
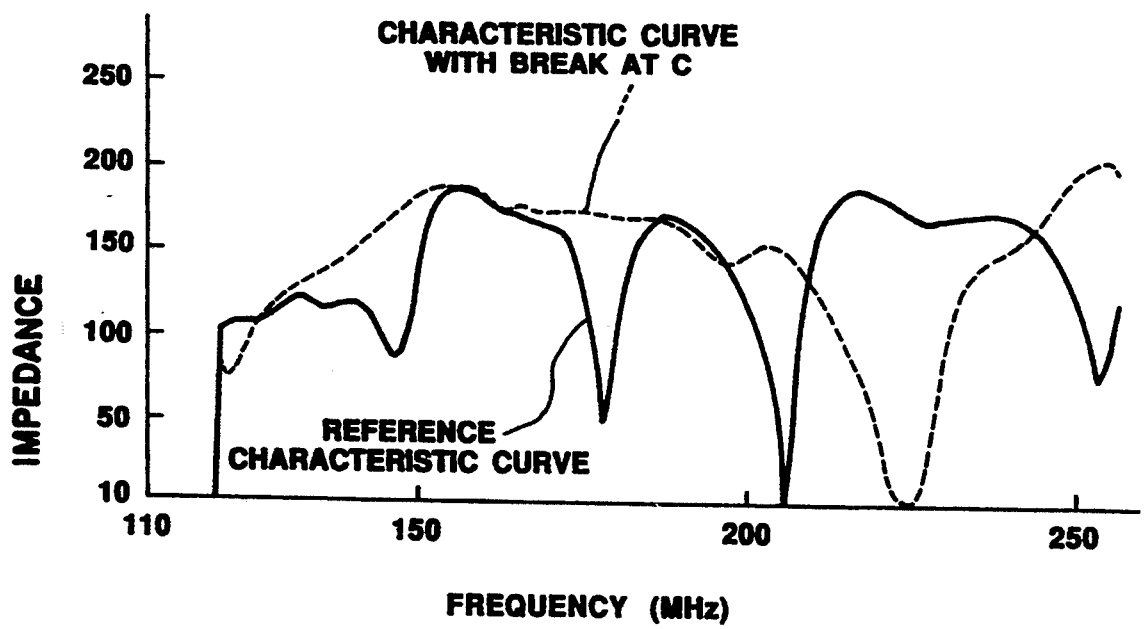

FIG. 7 shows data measured at various frequencies between the antenna pattern 60 and the electrically conductive layer Q, the antenna pattern 60 having a wire break at a position C (FIG. 4) on the branch pattern 60a which is about 100 mm spaced from the terminal 60c.

Figure 8:
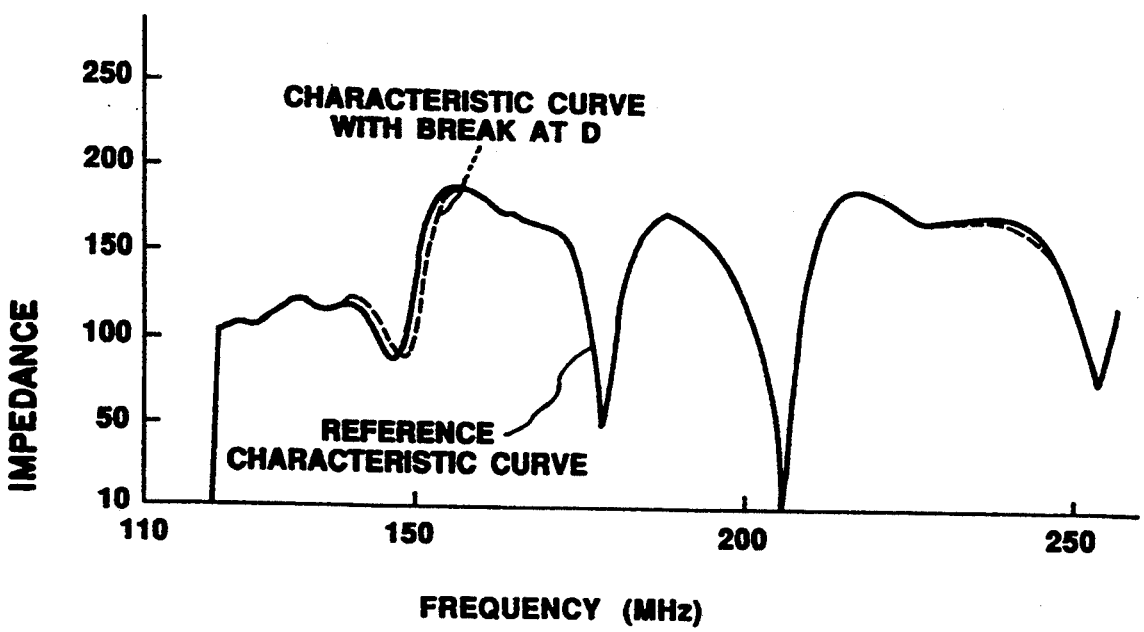
Figure 9:
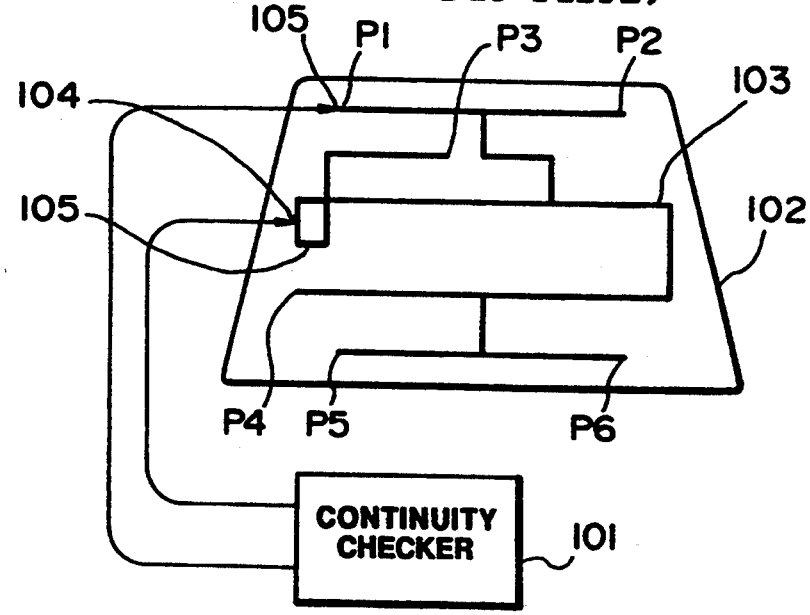
FIG. 9 is a diagram showing a conventional conductivity inspecting system.
Figure 10:
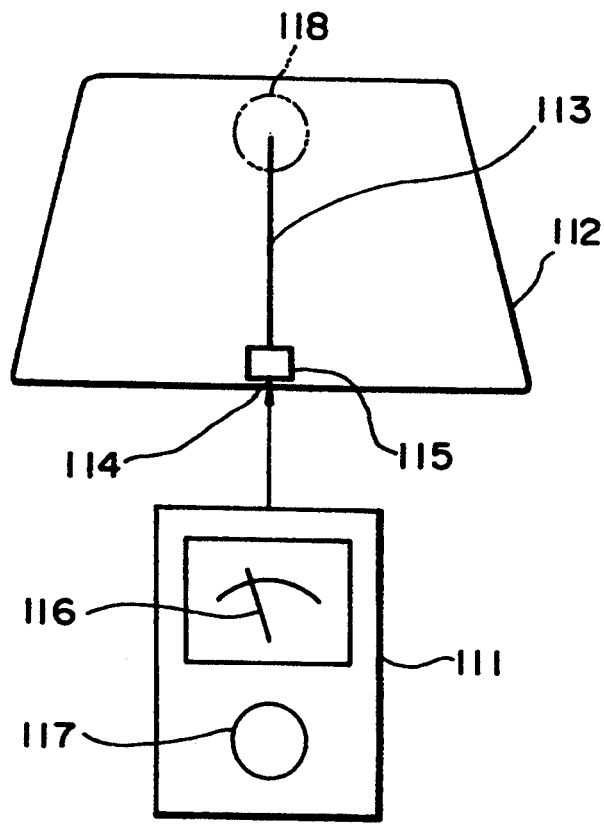
FIG. 10 is a diagram showing another conventional conductivity inspecting system.

FIG. 8 shows data measured at various frequencies between the antenna pattern 60 and the electrically conductive layer Q, the antenna pattern 60 having a wire break at a position D (FIG. 4) which is about 10 mm spaced from the tip end of the branch pattern 60b.

It can be seen from FIGS. 5 through 8 that the frequency characteristic curves of the antenna patterns 60 with wire breaks in the branch patterns 60a, 60b are shifted from the reference frequency characteristic curve. Since frequency shifts particularly at valleys from the reference frequency characteristic curve are distinct, they allow wire breaks to be detected reliably even if the wire breaks are slightly spaced from the tip ends of the branch patterns 60a, 60b.

When the antenna pattern 60 suffers a short circuit between the branch patterns 60a, 60b, the measured frequency characteristic curve is largely shifted from the reference frequency characteristic curve. Therefore, such a short circuit can also easily be detected.

The frequencies used to inspect antenna patterns should preferably be in a wider range, particularly on the high frequency side than the range of frequencies in which radio waves can be received by the antenna patterns to be inspected. Such a frequency range is effective to detect small antenna pattern changes such as wire breaks and short circuits.

The configuration and position of the electrically conductive layer Q may be varied depending on the antenna pattern P to be inspected, for any shifts in the frequency characteristic curve due to wire breaks to appear distinctly.

In the illustrated embodiments, the present invention is embodied in a system for inspecting an antenna pattern on window glass for wire breaks and short circuits. However, the principles of the present invention are also applicable to the inspection of other electrically conductive patterns such as on printed-circuit boards, liquid-crystal display units, or the like.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. The scope of the invention is indicated by the appended claims rather than by the foregoing description.

What is claimed is:

1. A system for inspecting an inspection electrically conductive pattern on an insulative material, comprising:

an electrically conductive layer adapted to be spaced from the inspection electrically conductive pattern;

variable frequency signal supply means for successively supplying high-frequency signals in a predetermined range of frequencies to the electrically conductive pattern;

reflected signal measuring means for measuring means for measuring impedances with respect to reflected signals from the electrically conductive pattern; and decision means for determining whether the electrically conductive pattern is acceptable, based on whether, with respect to a ratio between reflected signals and the high-frequency a frequency signals, a difference between the reference ratio with respect to a reference electrically conductive pattern and the inspection ratio with respect to the inspection electrically conductive pattern is less than a predetermined value.

2. A system according to claim 1, wherein said reflected signal measuring means comprises a directional coupler for supplying the high-frequency signals to the inspection electrically conductive pattern and extracting the reflected signals from the inspection electrically conductive pattern, a signal distributor for supplying the high-frequency signals from said variable frequency signal supply means to said directional coupler, and a processor for calculating the ratio between the reflected signals extracted by said directional coupler and the high-frequency signals from said signal distributor, and supplying the calculated ratio to said decision means.

* * * * *

UNITED STATES PATENT AND TRADEMARK OFFICE
CERTIFICATE OF CORRECTION

PATENT NO. :     5,337,004

DATED      :     Aug. 9, 1994

INVENTOR(S) :    Murakami et al.

It is certified that error appears in the above-identified patent and that said Letters Patent is hereby corrected as shown below:

Column 3, line 47, insert --5.-- after the word "device".

Column 7, line 52, "Fig." should read --Figs.--.

Column 9, line 6, delete "a frequency" after the word "high-frequency".

Signed and Sealed this

Twenty-sixth Day of September, 1995

Attest:

BRUCE LEHMAN

Attesting Officer     Commissioner of Patents and Trademarks